(12) United States Patent
Aparin

(10) Patent No.: US 9,111,222 B2
(45) Date of Patent: Aug. 18, 2015

(54) METHOD AND APPARATUS FOR SWITCHING THE BINARY STATE OF A LOCATION IN MEMORY IN A PROBABILISTIC MANNER TO STORE SYNAPTIC WEIGHTS OF A NEURAL NETWORK

(75) Inventor: Vladimir Aparin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 398 days.

(21) Appl. No.: 13/292,161

(22) Filed: Nov. 9, 2011

(65) Prior Publication Data

US 2013/0117209 A1 May 9, 2013

(51) Int. Cl.
*G06N 3/04* (2006.01)
*G06N 3/063* (2006.01)
*G06N 3/08* (2006.01)

(52) U.S. Cl.
CPC .............. *G06N 3/0472* (2013.01); *G06N 3/063* (2013.01); *G06N 3/04* (2013.01); *G06N 3/08* (2013.01)

(58) Field of Classification Search
CPC .................. G06N 3/08; G06N 3/04
USPC .......................................... 706/25
See application file for complete search history.

(56) References Cited

U.S. PATENT DOCUMENTS

| | | | |
|---|---|---|---|
| 3,341,823 A | 9/1967 | Connelly | |
| 4,904,881 A * | 2/1990 | Castro | 326/52 |
| 4,999,525 A * | 3/1991 | Park et al. | 326/52 |
| 6,844,582 B2 | 1/2005 | Ueda | |
| 6,948,102 B2 | 9/2005 | Smith | |
| 7,827,130 B2 | 11/2010 | Nugent | |
| 7,930,257 B2 | 4/2011 | Nugent | |
| 7,962,429 B2 | 6/2011 | Adams et al. | |
| 2006/0006997 A1 | 1/2006 | Rose-Pehrsson et al. | |
| 2010/0332043 A1 | 12/2010 | Weyland | |
| 2012/0259804 A1 | 10/2012 | Brezzo et al. | |
| 2013/0132314 A1 * | 5/2013 | Snider | 706/15 |

FOREIGN PATENT DOCUMENTS

| | | |
|---|---|---|
| TW | 200409123 A | 6/2006 |
| TW | 200923803 A | 6/2009 |
| TW | 201010407 A | 3/2010 |
| TW | 201118407 A | 6/2011 |
| TW | I345899 B | 7/2011 |
| WO | 9318474 A1 | 9/1993 |

OTHER PUBLICATIONS

Yamagishi et al., A Novel Nonvolatile Memory with Spin Torque Transfer Magnetization Switching: Spin-RAM, Electron Devices Meeting, 2005. IEDM Technical Digest, Dec. 5, 2005, pp. 459-462.*
Foiling et al., Single-Electron Latching Switches as Nanoscale Synapses, International Joint Conference on Neural Networks, pp. 216-221, Jul. 15-19, 2001.*

(Continued)

*Primary Examiner* — Jeffrey A Gaffin
*Assistant Examiner* — Robert H Bejeck, II
(74) *Attorney, Agent, or Firm* — Rupit M. Patel

(57) ABSTRACT

Certain aspects of the present disclosure support a technique for utilizing a memory in probabilistic manner to store information about weights of synapses of a neural network.

36 Claims, 8 Drawing Sheets

(56) References Cited

OTHER PUBLICATIONS

Deolalikar, Mapping Boolean Functions with Neural Networks having Binary Weights and Zero Thresholds, IEEE Trans Neural Netw. 2001;12(3):639-42 (reprinted version pp. 10).*

Thakoor et al., Binary Synaptic Connections Based on Memory Switching in a-Si:H for Artificial Neural Networks, MRS Proceedings, vol. 95, pp. 6, 1987.*

Clarkson, T. G. et al., "pRAM automata", Proceedings of IEEE International Workshop on Cellular Neural Networks and their Applications (CNNA), Dec. 16, 1990, pp. 235-243, XP010010755.

Goldberg, D. H. et al., "Analog VLSI spiking neural network with address domain probabilistic synapses", The 2001 IEEE International Symposium on Circuits and Systems (ISCAS), May 6, 2001, pp. 241-244, vol. 3, IEEE Service Center, Piscataway, NJ, USA, XP010541121, DOI: 10.1109/ISCAS.2001.921292 ISBN: 978-0-7803-6685-5.

International Search Report and Written Opinion—PCT/US2012/063719—ISA/EPO—Jun. 3, 2013.

Krzysteczko, Patryk et al., "The Memristive Magnetic Tunnel Junction as a Nanoscopic Synapse-Neuron System", Advanced Materials, Feb. 7, 2012, pp. 762-766, vol. 24, No. 6. XP055054723, ISSN: 0935-9648, DOI: 10.1002/adma.201103723.

Petersen C.C.H., et al., "All-or-None Potentiation at CA3-CAI Synapses", in Proceedings of National Academy of Lined Through Science USA, vol. 95, pp. 4732-4737, Apr. 1998.

T. Elliot, "Discrete states of synaptic strength in a stochastic model of spike-timing-dependent plasticity", in Journal of Neural Computation, vol. 22, pp. 244-272, Jan. 2010.

Taiwan Search Report—TW101141569—TIPO—Sep. 1, 2014.

* cited by examiner

METHOD AND APPARATUS FOR SWITCHING THE BINARY STATE OF A LOCATION IN MEMORY IN A PROBABILISTIC MANNER TO STORE SYNAPTIC WEIGHTS OF A NEURAL NETWORK

BACKGROUND

1. Field

Certain aspects of the present disclosure generally relate to neural system engineering and, more particularly, to a method and apparatus for utilizing a memory in probabilistic manner to store information about synaptic weights of a neural network.

2. Background

Neural networks can have hundreds of thousands of synapses, wherein weights of the synapses can be learned during network training During the course of training, the weights are typically initialized with random values and changed in small increments. Often, the synaptic weights are stored in a multi-bit or multi-level memory. However, in many cases, the weights may settle to one of two values (bimodal distribution of weights). Therefore, using the multi-bit memory to store final binary weights can be waste of storage resources. Moreover, addressing the multi-bit synaptic memory during network training or operation can be a bottleneck of speed.

SUMMARY

Certain aspects of the present disclosure provide a method of storing information in a memory. The method generally includes computing, for each synapse of a plurality of synapses in a neural network, an update of a weight of that synapse according to a learning rule, and switching, in probabilistic manner for each of the synapses, a binary state of a location within the memory associated with that synapse based on the update of weight.

Certain aspects of the present disclosure provide an apparatus for storing information in a memory. The apparatus generally includes a first circuit configured to compute, for each synapse of a plurality of synapses in a neural network, an update of a weight of that synapse according to a learning rule, and a second circuit configured to switch, in probabilistic manner for each of the synapses, a binary state of a location within the memory associated with that synapse based on the update of weight.

Certain aspects of the present disclosure provide an apparatus for storing information in a memory. The apparatus generally includes means for computing, for each synapse of a plurality of synapses in a neural network, an update of a weight of that synapse according to a learning rule, and means for switching, in probabilistic manner for each of the synapses, a binary state of a location within the memory associated with that synapse based on the update of weight.

Certain aspects of the present disclosure provide a computer program product for storing information in a memory. The computer program product generally includes a computer-readable medium comprising code for computing, for each synapse of a plurality of synapses in a neural network, an update of a weight of that synapse according to a learning rule, and switching, in probabilistic manner for each of the synapses, a binary state of a location within the memory associated with that synapse based on the update of weight.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Neural System

Figure 1:
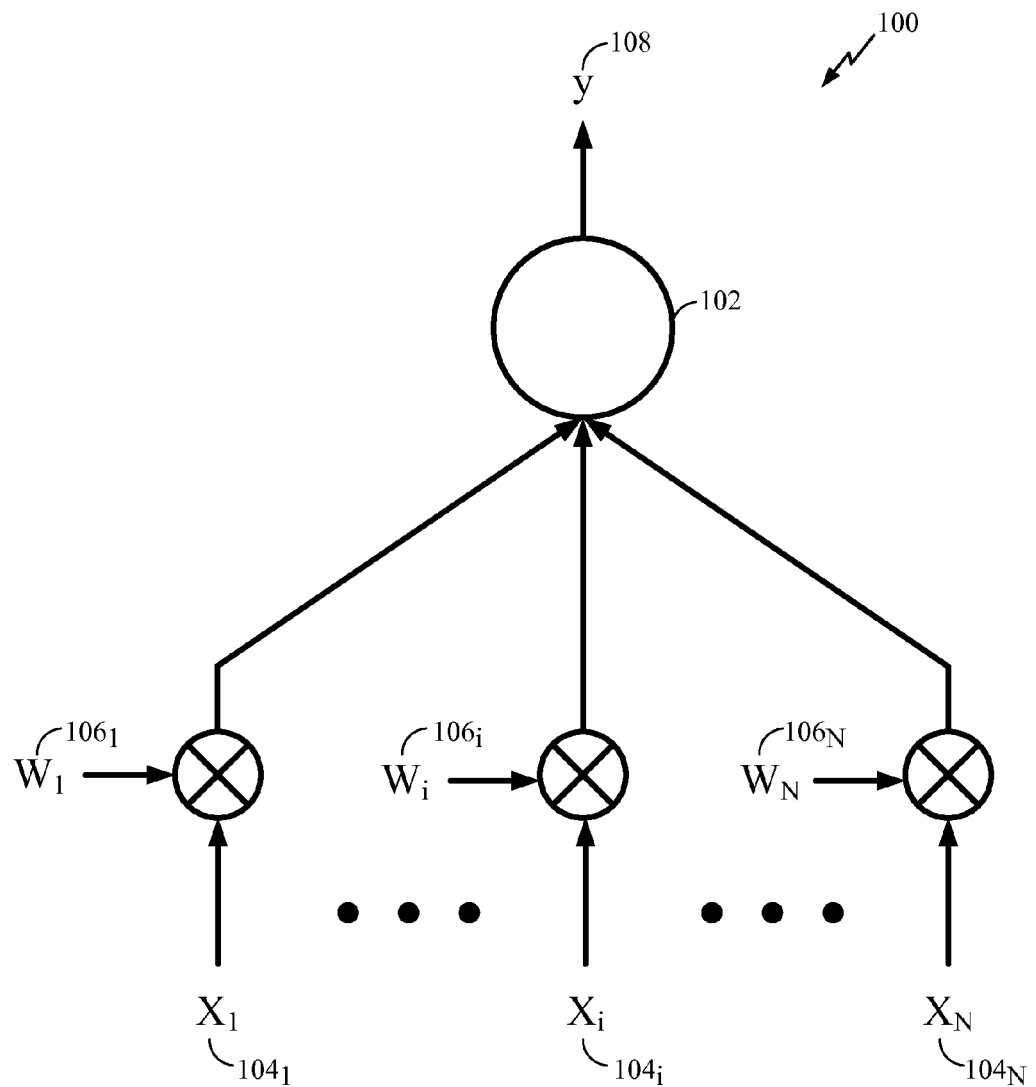
FIG. 1 illustrates an example processing unit of a neural system in accordance with certain aspects of the present disclosure.

FIG. 1 illustrates an example 100 of a processing unit (e.g., a neuron) 102 of a computational network (e.g., a neural system or a neural network) in accordance with certain aspects of the present disclosure. The neuron 102 may receive multiple input signals $104_1$-$104_N$ ($x_1$-$x_N$), which may be signals external to the neural system, or signals generated by other neurons of the same neural system, or both. The input signal may be a current or a voltage, real-valued or complex-valued. The input signal may comprise a numerical value with a fixed-point or a floating-point representation. These input signals may be delivered to the neuron 102 through synaptic connections that scale the signals according to adjustable synaptic weights $106_1$-$106_N$ ($w_1$-$w_N$), where N may be a total number of input connections of the neuron 102.

The neuron 102 may combine the scaled input signals and use the combined scaled inputs to generate an output signal 108 (i.e., a signal y). The output signal 108 may be a current, or a voltage, real-valued or complex-valued. The output signal may comprise a numerical value with a fixed-point or a floating-point representation. The output signal 108 may be then transferred as an input signal to other neurons of the same neural system, or as an input signal to the same neuron 102, or as an output of the neural system.

The processing unit (neuron) 102 may be emulated by an electrical circuit, and its input and output connections may be emulated by wires with synaptic circuits. The processing unit 102, its input and output connections may also be emulated by a software code. The processing unit 102 may also be emulated by an electric circuit, whereas its input and output connections may be emulated by a software code. In one aspect of the present disclosure, the processing unit 102 in the computational network may comprise an analog electrical circuit. In another aspect, the processing unit 102 may comprise a digital electrical circuit. In yet another aspect, the processing unit 102 may comprise a mixed-signal electrical circuit with both analog and digital components. The computational network may comprise processing units in any of the aforementioned forms. The computational network (neural system or neural network) using such processing units may be utilized in a large range of applications, such as image and pattern recognition, machine learning, motor control, and alike.

During the course of training of neural network, the synaptic weights (e.g., the weights $106_1$-$106_N$ from FIG. 1) may be initialized with random values and changed in small increments according to a learning rule (e.g., the spike-timing-dependent plasticity (STDP) learning rule, the Hebb rule, the Oja rule, the Bienenstock-Copper-Munro (BCM) rule, etc). Very often, the weights may settle to one of two values (i.e., bimodal distribution of weights). Certain aspect of the present disclosure utilize this to reduce the number of bits per synaptic weight, increase the speed of reading and writing from/to a memory storing the synaptic weights, and to reduce power consumption of the memory.

In an aspect, a multi-bit memory may be employed for storing the synaptic weights. This kind of memory may reduce the number of synaptic weights stored in a given-capacity memory. However, reading and writing of synaptic weights may be slower because several bits per weight may need to be read or written.

In another aspect, an analog multi-level memory (e.g., based on memristors) may be utilized for storing synaptic weights. However, there are several problems with this kind of memory. First, the analog memory may require sophisticated writing, i.e., precise control of pulse magnitude and duration may be required. Second, the memory reading may also need to be sophisticated, e.g., digitization of stored values when being read from the memory may be required. Third, efficient cloning of the analog multi-level memory may not be possible. Fourth, the analog memory may often have poor retention and reliability.

Method of Utilizing Memory in Probabilistic Manner

To reduce a number of bits per synaptic weight and power consumption of a memory storing the weights, a method of utilizing the memory in probabilistic manner is proposed in the present disclosure. According to certain aspects of the present disclosure, the synaptic weights (e.g., the weights $106_1$-$106_N$ from FIG. 1) may be represented as binary states of memory locations (i.e., only 0s and 1s may be stored in memory locations).

During training of a neural network, an update of a weight for each synapse of a plurality of synapses in the neural network may be computed according to a weight-learning rule (e.g., the STDP rule, the Hebb rule, the Oja rule, or the BCM rule). Then, binary states of memory locations associated with the plurality of synapses may be switched in the probabilistic manner based on weight updates. After many training events, a probability of each weight being in one of the two states (0 or 1) may be proportional to the total update of this weight, i.e., proportional to the final weight.

It should be noted that representing synaptic weights with binary values is possible because experimental data indicates that biological synapses may tend to have the bimodal distribution of weights. Further, binary synapses may be stored in one-bit memory, allowing more synapses to be stored in a given-capacity memory. Storage of synaptic weights in the probabilistic manner may facilitate time averaging of the synaptic training events, i.e., the trained memory state may show the accumulated effect of multiple training events.

Figure 2:
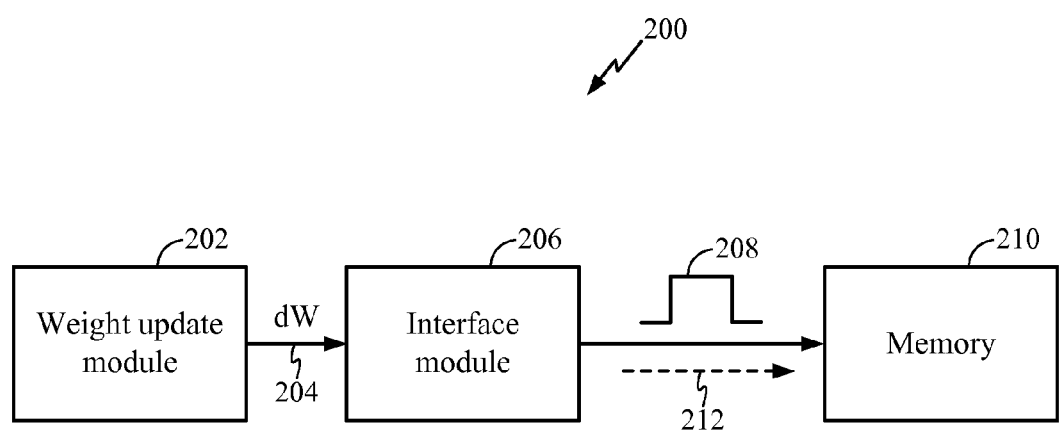
FIG. 2 illustrates an example of utilizing a memory for storing information in probabilistic manner in accordance with certain aspects of the present disclosure.

FIG. 2 illustrates an example 200 of utilizing a memory for storing information (e.g., synaptic weights) in probabilistic manner in accordance with certain aspects of the present disclosure. As illustrated in FIG. 2, a weight update module 202 may be configured to compute an update 204 of a weight associated with a synapse of a neural network that is being trained according to a specific learning rule.

In one aspect of the present disclosure, an interface module 206 may be configured to generate, with a certain probability, a signal 208 (e.g., a pulse) based on the update of weight 204. For example, a sign of the pulse (positive or negative pulse) may correspond to a sign of the weight update 204. A binary state of memory location within a memory 210 representing that particular weight may be switched (i.e., changed from zero to one, or vice versa) based on the pulse 208. In an aspect, the switching direction may be based on the sign of pulse 208. It should be noted that the memory 210 storing the synaptic weights of the neural network may comprise a fully deterministic memory with binary values in memory locations, wherein the stored binary values are obtained in probabilistic manner.

By applying this approach, the size of memory 210 may be small (e.g., one bit per synaptic weight), which may also provide reduction in memory power consumption. Further, the speed of loading and storing of memory content may be fast since each synaptic weight can be represented with one-bit number.

Figure 3:
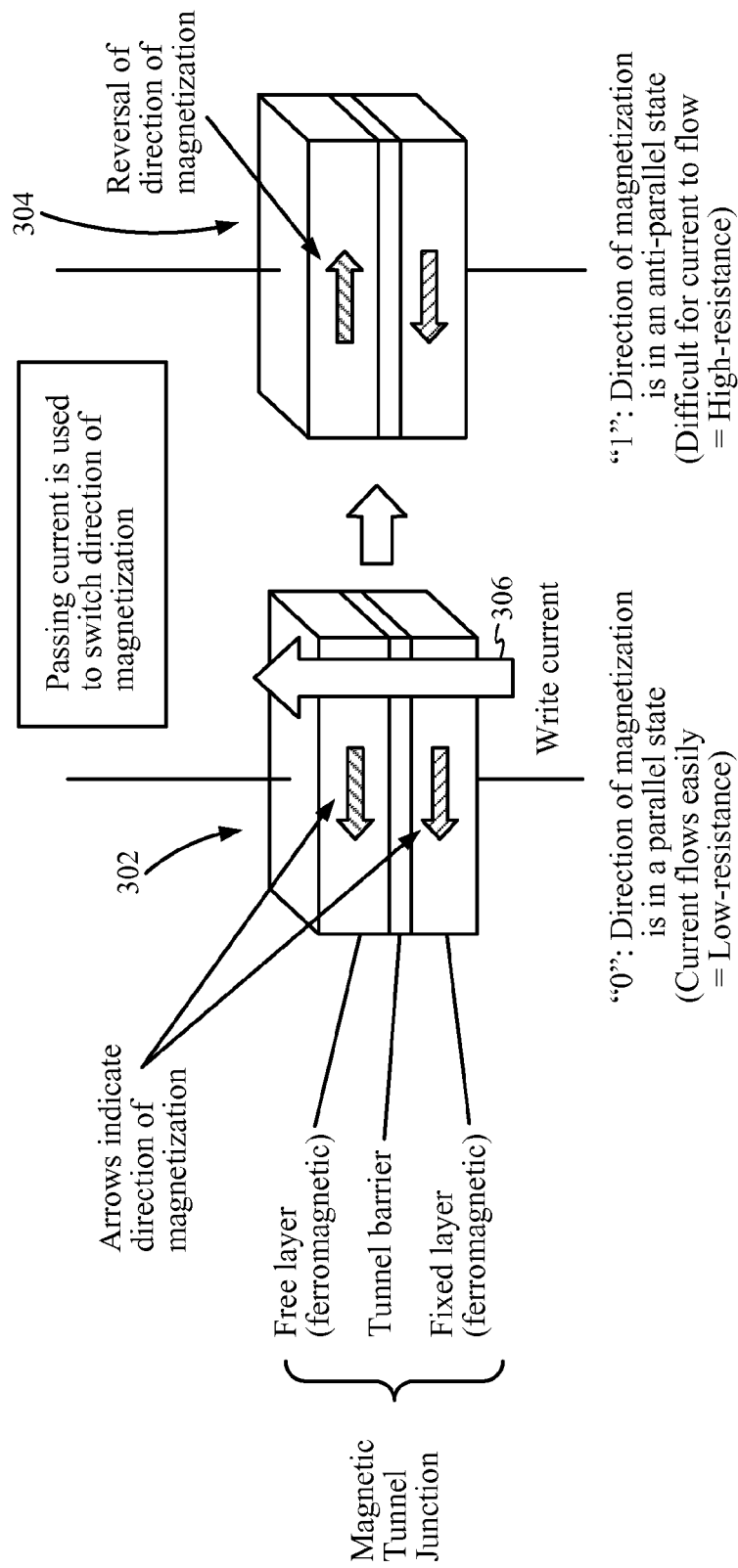
FIG. 3 illustrates an example of spin-torque transfer (STT) memory in accordance with certain aspects of the present disclosure.

In another aspect of the present disclosure, the memory 210 that stores the synaptic weights may comprise a probabilistic nonvolatile binary memory. For example, the probabilistic nonvolatile binary memory may be based on magnetic tunnel junction (MTJ) or spin torque transfer (STT) devices. These devices can act as binary resistive switches whose switching from one state to another is a probabilistic event with the probability being a function of the write current/voltage magnitude and duration, as illustrated in FIG. 3. In examples 302, 304, a passing current 306 may be used to switch direction of magnetization. As illustrated in FIG. 3, the binary zero may be stored in a location of the STT memory if direction of magnetization is in a parallel state (i.e., the current 306 may flow easily though ferromagnetic layers because of a low resistance). On the other hand, the binary one may be stored in the memory location if direction of magnetization is in an anti-parallel state (i.e., the current 306 may flow with certain difficulties though ferromagnetic layers due to a high resistance).

According to certain aspects, the STT memory may achieve 2:1 high resistance/low resistance ratio (e.g., the ratio 4 KΩ/2 KΩ). Further, the STT memory may provide excellent retention (e.g., more than ten years) and reliability, while the power consumption may be very low. However, switching between binary states is probabilistic due to random thermal effects.

Figure 4A:
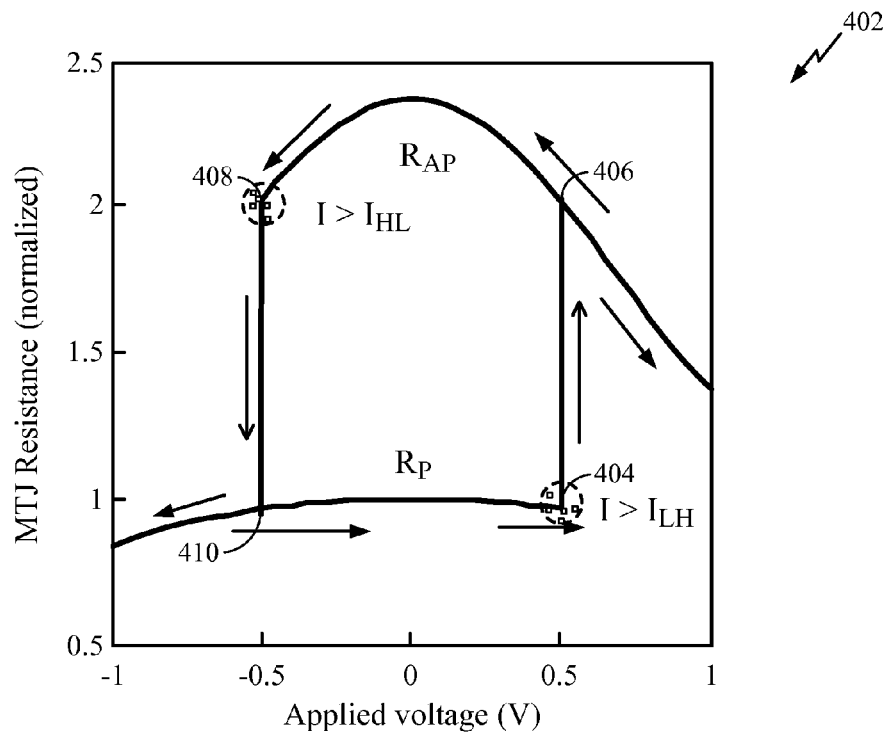
FIGS. 4A-4B illustrate example graphs related to probabilistic switching of the STT memory in accordance with certain aspects of the present disclosure.

It should be noted that a probability of switching of a binary content in STT memory location may depend on at least one of: a magnitude of write current (e.g., the magnitude in the range of 0.1-10 mA), or a write time (e.g., 1-100 ns). As illustrated in a graph 402 in FIG. 4A, once the write current (e.g., the current 306 from FIG. 3) becomes larger than a first threshold (e.g., a threshold $I_{LH}$ illustrated in FIG. 4A), MTJ resistance may increase substantially (e.g., from a value 404 to a value 406), and a value of corresponding memory location may switch to binary one. Further, when the write current becomes smaller than a second threshold (e.g., a threshold $I_{HL}$ from FIG. 4A), the MTL resistance may become low (e.g., decrease from a value 408 to a value 410), and a value of corresponding memory location may switch to binary zero.

Figure 4B:
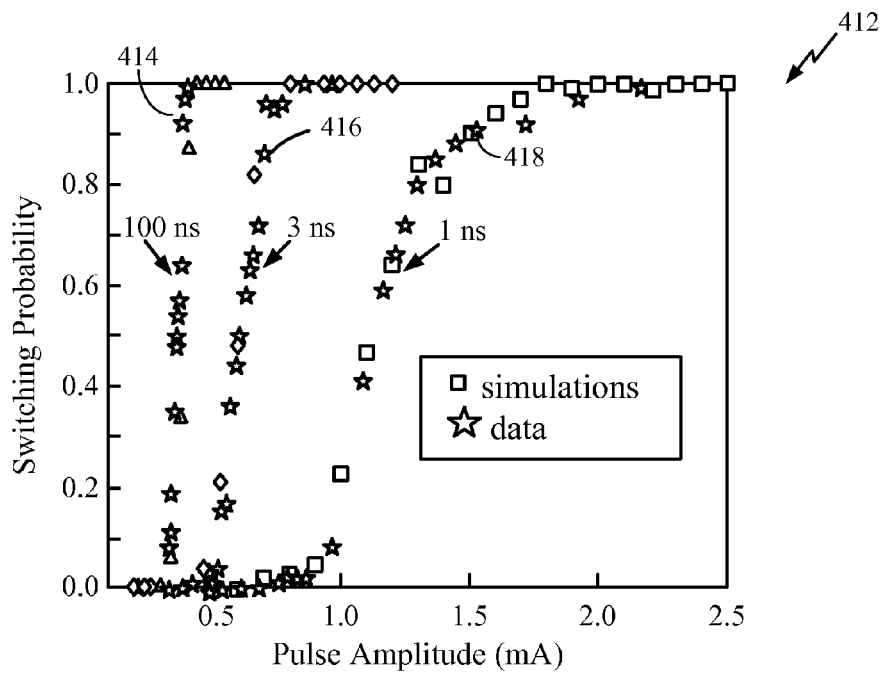

FIG. 4B illustrates a graph 412 of a switching probability in an STT memory as a function of current (pulse) amplitude and write time. It can be observed from the graph 412 that a longer write time may provide the same switching probability for a lower current magnitude (e.g., a switching probability plot 414 for the write time of 100 ns vs. a switching probability plot 416 for the write time of 3 ns vs. a switching probability plot 418 for the write time of 1 ns).

Referring back to FIG. 2, the module 202 may be configured to compute the synaptic weight update 204 for each weight according to the chosen learning rule (e.g., the rate-based learning rule or the STDP rule). In an aspect of the present disclosure, an absolute value of the weight update 204 may determine (e.g., by the interface module 206) a magnitude $I_{write}$ of a write current 212 flowing though the STT memory device 210. The sign of weight update may determine the direction of the current 212.

In an aspect of the present disclosure, a new synaptic weight may be written into the STT memory 210 using $I_{write}$ being proportional to the weight update 204. Positive $I_{write}$ may switch a binary value of memory location from zero (minimum value for the synaptic weight) to one (maximum value for the synaptic weight) with a certain probability. On the other hand, negative $I_{write}$ may switch the binary value of memory location from one (maximum value for the synaptic weight) to zero (minimum value for the synaptic weight) with a certain probability.

The aforementioned approach may achieve a very small size of memory per synapse (e.g., only one MTJ or STT per synapse). This may also help in reducing the power consumption of synaptic weight memory. Further, the memory operation may be very simple, e.g., switching between binary states may be achieved only with a write current of a certain magnitude and direction.

Figure 5:
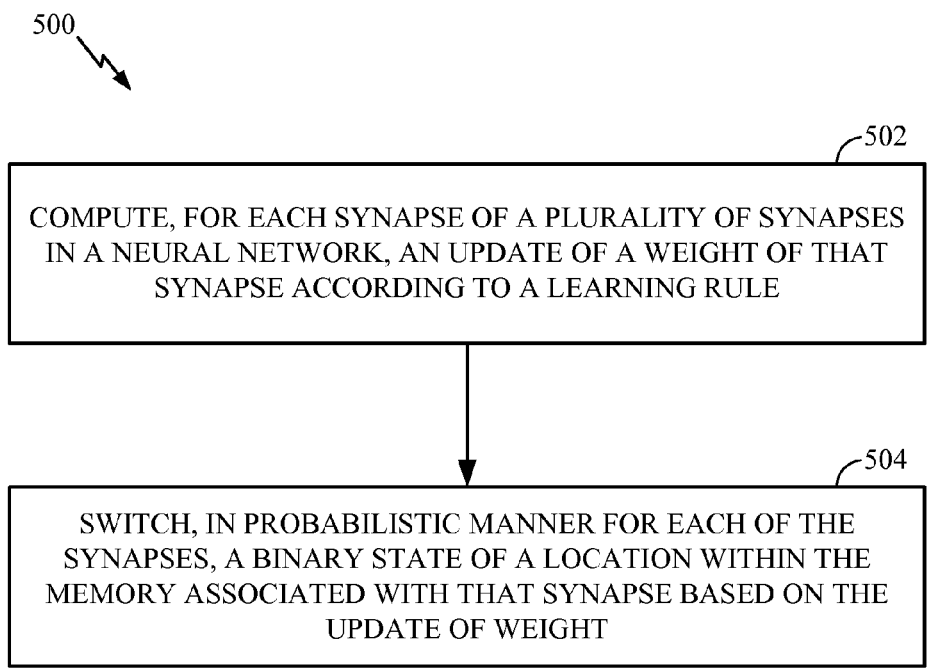
FIG. 5 illustrates example operations for using a memory in probabilistic manner in accordance with certain aspects of the present disclosure.

FIG. 5 illustrates example operations 500 for utilizing a memory in probabilistic manner for storing information in accordance with certain aspects of the present disclosure. At 502, for each synapse of a plurality of synapses in a neural network, an update of a weight of that synapse may be computed according to a learning rule. At 504, a binary state of a location within the memory associated with that synapse may be switched in probabilistic manner based on the update of weight. In one aspect, the neural network may comprise a spiking neural network. In another aspect, the neural network may comprise a rate-based neural network.

In one aspect of the present disclosure, switching the binary state in the probabilistic manner may comprise generating, with a probability, a pulse based on the update of weight, and switching the binary state of memory location using the pulse. For example, the probability may be proportional to an absolute value of the update of weight, and direction of the switching may be based on a sign of the update of weight.

In another aspect of the present disclosure, an absolute value of the update of weight may determine a magnitude of electrical current flowing through the memory location, and a sign of the update of weight may determine a direction of the electrical current flowing through the memory location. The binary state of memory location may be switched, with a probability, based on the direction of electrical current. For example, the probability may be proportional to the magnitude of electrical current.

In an aspect, the memory may comprise a probabilistic nonvolatile binary memory. Further, the probabilistic nonvolatile binary memory may comprise an STT memory.

According to certain aspects of the present disclosure, the aforementioned learning rule may comprise weight learning rules of spiking and rate-based neural networks. For example, the weight learning rules of spiking and rate-based neural networks may comprise at least one of the STDP rule, the Hebb rule, the Oja rule, or the Bienenstock-Cooper-Munro (BCM) rule.

Figure 6:
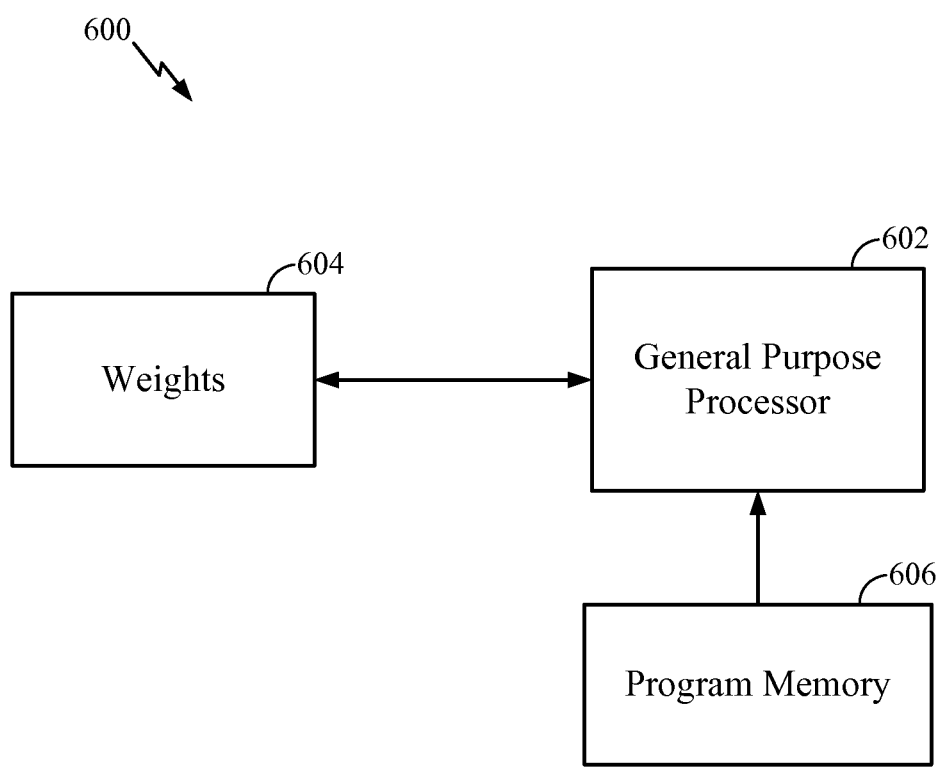
FIG. 6 illustrates an example software implementation of probabilistic memory usage utilizing a general-purpose processor in accordance with certain aspects of the present disclosure.

FIG. 6 illustrates an example software implementation 600 of the aforementioned probabilistic memory usage utilizing a general-purpose processor 602 in accordance with certain aspects of the present disclosure. Existing weights associated with each processing unit (neuron) of a computational network (neural network) may be stored in a memory block 604, while instructions related to the probabilistic memory usage being executed at the general-purpose processor 602 may be loaded from a program memory 606. According to certain aspects of the present disclosure, the loaded instructions may comprise code for computing, for each synapse of a plurality of synapses in the neural network, an update of a weight of that synapse according to a learning rule. Further, the loaded instructions may comprise code for switching, in probabilistic manner for each of the synapses, a binary state of a location within the memory block 604 associated with that synapse based on the update of weight.

Figure 7:
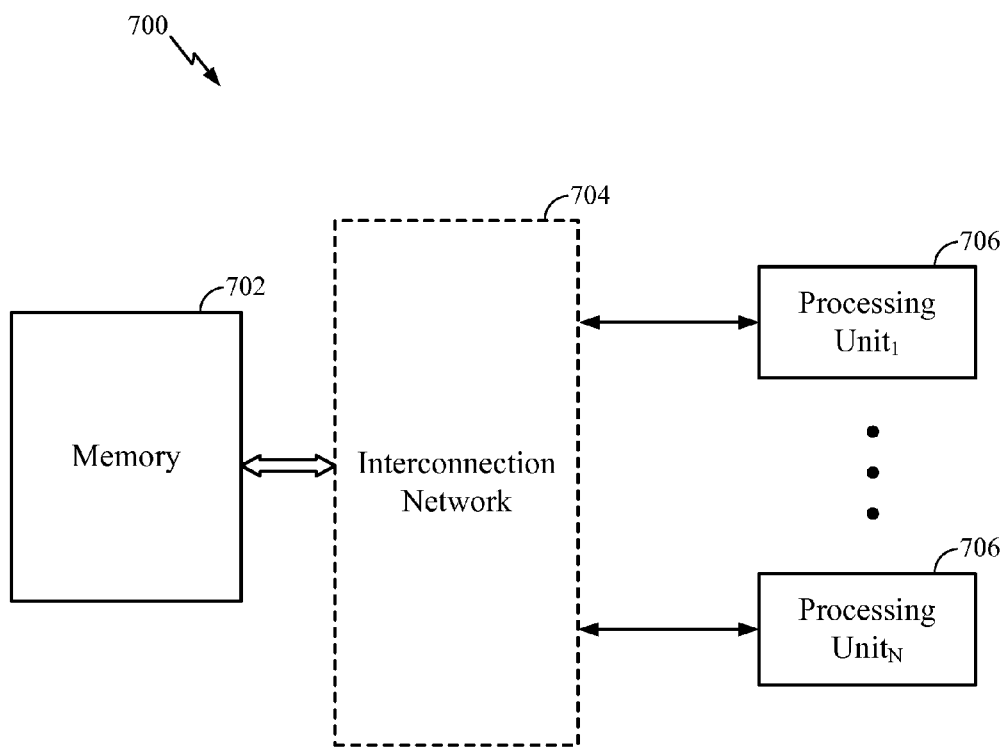
FIG. 7 illustrates an example implementation of probabilistic memory usage where a weight memory is interfaced with individual distributed processing units in accordance with certain aspects of the present disclosure.

FIG. 7 illustrates an example implementation 700 of the aforementioned probabilistic memory usage where a weight memory 702 is interfaced via an interconnection network 704 with individual (distributed) processing units (neurons) 706 of a computational network (neural network) in accordance with certain aspects of the present disclosure. At least one existing weight associated with a processing unit 706 may be loaded from the memory 702 via connection(s) of the interconnection network 704 into that processing unit 706. The processing unit 706 may be configured to compute, for each synapse of a plurality of synapses in the neural network associated with that processing unit (neuron) 706, an update of a weight of that synapse according to a learning rule. Further, the processing unit 706 may be configured to switch, in probabilistic manner for each of the synapses, a binary state of a location within the memory 702 associated with that synapse based on the update of weight.

Figure 8:
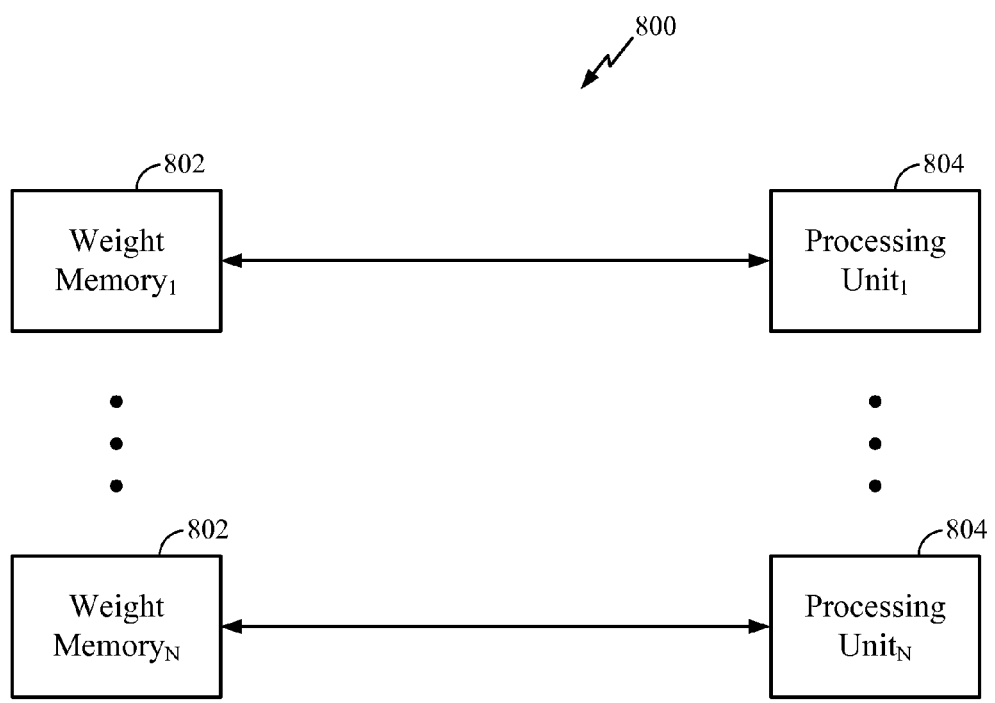
FIG. 8 illustrates an example implementation of probabilistic memory usage based on distributed weight memories and distributed processing units in accordance with certain aspects of the present disclosure.

FIG. 8 illustrates an example implementation 800 of the aforementioned probabilistic memory usage based on distributed weight memories 802 and distributed processing units 804 in accordance with certain aspects of the present disclosure. As illustrated in FIG. 8, one weight memory bank 802 may be directly interfaced with one processing unit (neuron) 804 of a computational network (neural network), wherein that memory bank 802 may store at least one existing weight associated with that processing unit 804. The processing unit 804 may be configured to compute, for each synapse of a plurality of synapses in the neural network associated with that processing unit (neuron) 804, an update of a weight of that synapse according to a learning rule. Further, the processing unit 804 may be configured to switch, in probabilistic manner for each of the synapses based on the update of weight, a binary state of a memory location for that synapse within the memory bank 802 associated with that particular processing unit (neuron) 804.

Although the embodiments herein are shown for spiking neural networks, the use of these concepts to other neural network types including but not limited to rate-based neural networks is also within the scope of the present disclosure.

Figure 5A:
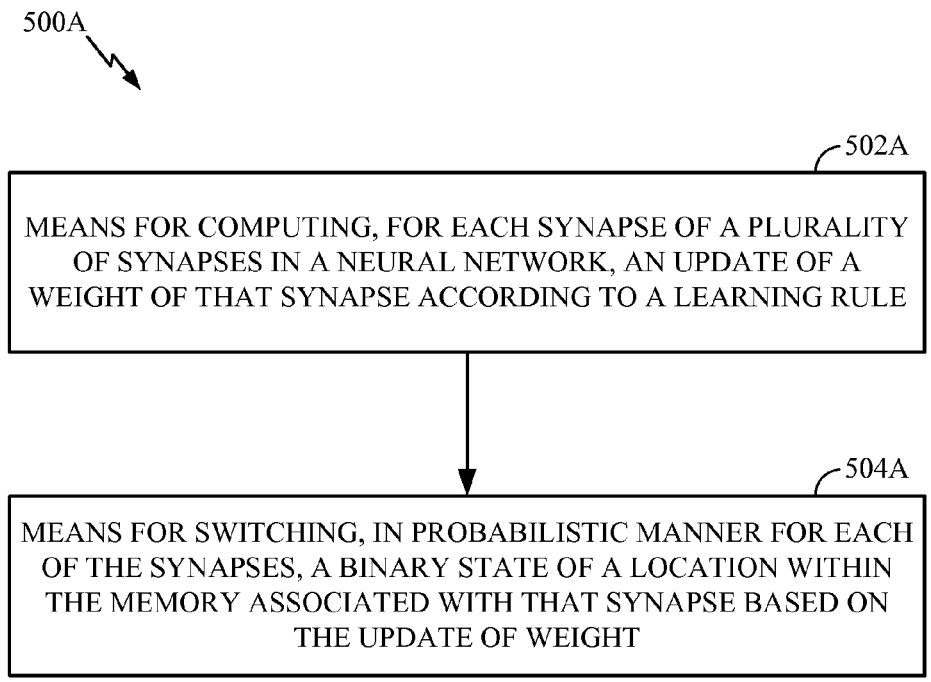
FIG. 5A illustrates example components capable of performing the operations illustrated in FIG. 5.

The various operations of methods described above may be performed by any suitable means capable of performing the corresponding functions. The means may include various hardware and/or software component(s) and/or module(s), including, but not limited to a circuit, an application specific integrate circuit (ASIC), or processor. Generally, where there are operations illustrated in Figures, those operations may have corresponding counterpart means-plus-function components with similar numbering. For example, operations 500 illustrated in FIG. 5 correspond to components 500A illustrated in FIG. 5A.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Bluray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

The invention claimed is:

1. A method of storing information in a memory, comprising:
   computing, for each synapse of a plurality of synapses in a neural network, an update of a weight of that synapse according to a learning rule; and
   switching, in probabilistic manner for each of the synapses, a binary state of a location within the memory associated with that synapse based on the update of the weight, wherein switching the binary state in the probabilistic manner comprises:
   based on the update of the weight, generating, with a probability of switching, a pulse or an electrical current, the pulse and the electrical current not being part of neuron spiking in the neural network, and
   switching the binary state of the location within the memory using the pulse or the electrical current.

2. The method of claim 1, wherein the probability is proportional to an absolute value of the update of weight.

3. The method of claim 1, wherein direction of the switching is based on a sign of the update of weight.

4. The method or claim 1, wherein:
   an absolute value of the update of the weight determines a magnitude of the electrical current flowing through the memory location,
   a sign of the update of the weight determines a direction of the electrical current flowing through the memory location, and the method further comprising:
   switching, based on the direction, the binary state of memory location with another probability.

5. The method of claim 4, wherein the other probability is proportional to the magnitude of the electrical current.

6. The method of claim 1, wherein the memory comprises a probabilistic nonvolatile binary memory.

7. The method of claim 6, wherein the probabilistic nonvolatile binary memory comprises a spin-torque transfer (STT) memory.

8. The method of claim 1, wherein the learning rule comprises weight learning rules of spiking and rate-based neural networks.

9. The method of claim 8, wherein the weight learning rules of spiking and rate-based neural networks comprise at least one of the spike-timing-dependent plasticity (STDP) rule, the Hebb rule, the Oja rule, or the Bienenstock-Cooper-Munro (BCM) rule.

10. An apparatus for storing information in a memory, comprising:
    a first circuit configured to compute, for each synapse of a plurality of synapses in a neural network, an update of a weight of that synapse according to a learning rule; and
    a second circuit configured to switch, in probabilistic manner for each of the synapses, a binary state of a location within the memory associated with that synapse based on the update of the weight, wherein the second circuit is also configured to:
    based on the update of the weight, generate, with a probability of switching, a pulse or an electrical current, the pulse and the electrical current not being part of neuron spiking in the neural network, and
    switch the binary state of the location within the memory using the pulse or the electrical current.

11. The apparatus of claim 10, wherein the probability is proportional to an absolute value of the update of the weight.

12. The apparatus of claim 10, wherein direction of the switching is based on a sign of the update of the weight.

13. The apparatus of claim 10, wherein:
    an absolute value of the update of the weight determines a magnitude of the electrical current flowing through the memory location,
    a sign of the update of the weight determines a direction of the electrical current lowing through the memory location, and the second circuit is also configured to:
    switch, based on the direction, the binary state of memory location with another probability.

14. The apparatus of claim 13, wherein the other probability is proportional to the magnitude of the electrical current.

15. The apparatus of claim 10, wherein the memory comprises a probabilistic nonvolatile binary memory.

16. The apparatus of claim 15, wherein the probabilistic nonvolatile binary memory comprises a spin-torque transfer (STT) memory.

17. The apparatus of claim 10, wherein the learning rule comprises weight learning rules of spiking and rate-based neural networks.

18. The apparatus of claim 17, wherein the weight learning rules of spiking and rate-based neural networks comprise at least one of the spike-timing-dependent plasticity (STDP) rule, the Hebb rule, the Oja rule, or the Bienenstock-Cooper-Munro (RCM) rule.

19. An apparatus for storing information in a memory, comprising:
    means for computing, for each synapse of a plurality of synapses in a neural network, an update of a weight of that synapse according to a learning rule; and
    means for switching, in probabilistic manner for each of the synapses, a binary state of a location within the memory associated with that synapse based on the update of the weight, wherein the means for switching the binary state in the probabilistic manner comprises:
        based on the update of the weight, means for generating, with a probability of switching, a pulse or an electrical current, the pulse and the electrical current not being part of neuron spiking in the neural network, and
        means for switching the binary state of the location within the memory using the pulse or the electrical current.

20. The apparatus of claim 19, wherein the probability is proportional to an absolute value of the update of the weight.

21. The apparatus of claim 19, wherein direction of the switching is based on a sign of the update of the weight.

22. The apparatus of claim 19, wherein:
    an absolute value of the update of the weight determines a magnitude of the electrical current flowing through the memory location,
    a sign of the update of the weight determines a direction of the electrical current flowing through the memory location, and the apparatus further comprising;
    means for switching, based on the direction, the binary state of memory location with another probability.

23. The apparatus of claim 22, wherein the other probability is proportional to the magnitude of the electrical current.

24. The apparatus of claim 19, wherein the memory comprises a probabilistic nonvolatile binary memory.

25. The apparatus of claim 24, wherein the probabilistic nonvolatile binary memory comprises a spin-torque transfer (STT) memory.

26. The apparatus of claim 19, wherein the learning rule comprises weight learning rules of spiking and rate-based neural networks.

27. The apparatus of claim 26, wherein the weight learning rules of spiking and rate-based neural networks comprise at least one of the spike-timing-dependent plasticity (STDP) rule, the Hebb rule, the Oja rule, or the Bienenstock-Cooper-Munro (BCM) rule.

28. A computer program product for storing information in a memory, a non-transitory computer-readable medium comprising code for:
    computing, for each synapse of a plurality of synapses in a neural network, an update of a weight of that synapse according to a learning rule;
    switching, in probabilistic manner for each of the synapses, a binary state of a location within the memory associated with that synapse based on the update of the weight;
        based on the update of the weight, generating, with a probability of switching, a pulse or an electrical current, the pulse and the electrical current not being part of neuron spiking in the neural network, and
    switching the binary state of the location within the memory using the pulse or the electrical current.

29. The computer program product of claim 28, wherein the probability is proportional to an absolute value of the update of the weight.

30. The computer program product of claim 28, wherein direction of the switching is based on a sign of the update of the weight.

31. The computer program product of claim 28, wherein:
    an absolute value of the update of the weight determines a magnitude of the electrical current flowing through the memory location,
    a sign of the update of weight determines a direction of the electrical current flowing through the memory location, and the computer-readable medium further comprising code for:
    switching, based on the direction, the binary state of memory location with another probability.

32. The computer program product of claim 31, wherein the other probability is proportional to the magnitude of the electrical current.

33. The computer program product of claim 28, wherein the memory comprises a probabilistic nonvolatile binary memory.

34. The computer program product of claim 33, wherein the probabilistic nonvolatile binary memory comprises a spin-torque transfer (STT) memory.

35. The computer program product of claim 28, wherein the learning rule comprises weight learning rules of spiking and rate-based neural networks.

36. The computer program product of claim 35, wherein the weight learning rules of spiking and rate-based neural networks comprise at least one of the spike-timing-dependent plasticity (STDP) rule, the Hebb rule, the Oja rule, or the Bienenstock-Cooper-Munro (BCM) rule.

* * * * *